(12) United States Patent
Song (10) Patent No.: US 11,114,647 B2
(45) Date of Patent: Sep. 7, 2021

(54) PIXEL ELEMENT, METHOD FOR FABRICATING THE SAME, DISPLAY CONTROL METHOD, AND DISPLAY PANEL

(71) Applicant: BOE Technology Group Co., Ltd., Beijing (CN)

(72) Inventor: Wenfeng Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 142 days.

(21) Appl. No.: 16/611,397

(22) PCT Filed: Jan. 31, 2019

(86) PCT No.: PCT/CN2019/074242
§ 371 (c)(1),
(2) Date: Nov. 6, 2019

(87) PCT Pub. No.: WO2020/015355
PCT Pub. Date: Jan. 23, 2020

(65) Prior Publication Data
US 2020/0220110 A1  Jul. 9, 2020

(30) Foreign Application Priority Data

Jul. 16, 2018 (CN) .......................... 201810778587.7

(51) Int. Cl.
*H01L 51/00* (2006.01)
*H01L 51/52* (2006.01)
*H01L 51/56* (2006.01)

(52) U.S. Cl.
CPC .......... *H01L 51/5281* (2013.01); *H01L 51/56* (2013.01)

(58) Field of Classification Search
CPC ............................ H01L 51/5281; H01L 51/56
See application file for complete search history.

(56) References Cited

U.S. PATENT DOCUMENTS

2004/0027642 A1  2/2004  Ahn et al.
2004/0223208 A1  11/2004 Yu et al.
(Continued)

FOREIGN PATENT DOCUMENTS

CN         1519636 A    8/2004
CN      101576693 A   11/2009
(Continued)

OTHER PUBLICATIONS

Office Action corresponding to Chinese Application No. 201810778587.7 dated Dec. 19, 2019.

*Primary Examiner* — Samuel A Gebremariam
(74) *Attorney, Agent, or Firm* — Arent Fox LLP; Michael Fainberg (57) ABSTRACT

Disclosed are a pixel element, a method for fabricating same, a display control method, a display panel. The pixel element includes a base substrate, display and non-display areas on the base substrate, a control electrode, an adjustment layer, a transparent electrode in the non-display area, the transparent electrode and the adjustment layer are arranged in a stack, the control electrode is at the interface between display and non-display areas, and surrounds the adjustment layer, and there is a gap area between the control electrode and the adjustment layer; and the adjustment layer includes charged particles configured to move to the control electrode and the transparent electrode under control of first and second electric fields, the first and second electric fields are created after signals are applied to the control electrode and the transparent electrode, and direction of the first electric field is opposite to direction of the second electric field.

18 Claims, 4 Drawing Sheets

(56) References Cited

U.S. PATENT DOCUMENTS

2005/0094087 A1    5/2005  Sikharulidze
2014/0374716 A1   12/2014  Kim et al.
2015/0030936 A1   10/2015  Wang
2017/0123265 A1    5/2017  Wang et al.
2018/0107086 A1    4/2018  Zhang
2019/0081220 A1    3/2019  Wang et al.

FOREIGN PATENT DOCUMENTS

| CN | 103969874 A |  8/2014 |
| CN | 104122732 A | 10/2014 |
| CN | 104241327 A | 12/2014 |
| CN | 104808384 A |  7/2015 |
| CN | 105573005 A |  5/2016 |
| CN | 107579147 A |  1/2018 |
| CN | 108983528 A | 12/2018 |
| EP |   1763082 A2 |  3/2007 |

PIXEL ELEMENT, METHOD FOR FABRICATING THE SAME, DISPLAY CONTROL METHOD, AND DISPLAY PANEL

This application is a National Stage of International Application No. PCT/CN2019/074242, filed on Jan. 31, 2019, which claims the priority of Chinese Patent Application No. 201810778587.7, filed with the Chinese Patent Office on Jul. 16, 2018, and entitled "A pixel element, a method for fabricating the same, a display control method, and a display panel", both of which are hereby incorporated by reference in their entireties.

FIELD

This disclosure relates to the field of display technologies, and particularly to a pixel element, a method for fabricating the same, a display control method, and a display panel.

BACKGROUND

At present, a display panel which can display an image in a transparent mode has emerged in the field of display technologies, and the display panel operates under such an operating principle that while a pixel element in the display panel is displaying, an image can be displayed at the pixel element; and while the pixel element in the display panel is not displaying, the pixel element is transparent so that an object on the backside of the display panel can be see through the display panel at the pixel element.

SUMMARY

In a first aspect, some embodiments of this disclosure provides a pixel element including a base substrate, and a display area and a non-display area located on the base substrate, wherein the pixel element further includes:

a control electrode, an adjustment layer, and a transparent electrode located in the non-display area, wherein the adjustment layer and the transparent electrode are arranged in a stack, the control electrode is located at an interface between the display area and the non-display area, and surrounds the adjustment layer, and there is a gap area between the control electrode and the adjustment layer; and the adjustment layer includes charged particles configured to move to the control electrode under a control of a first electric field, and to move to the transparent electrode under a control of a second electric field, wherein the first electric field and the second electric field are electric fields created after signals are applied to the control electrode and the transparent electrode respectively, and a direction of the first electric field is opposite to a direction of the second electric field.

In a possible implementation, in the pixel element according to some embodiments of this disclosure, an insulation material is filled in the gap area.

In a possible implementation, in the pixel element according to some embodiments of this disclosure, an orthographical projection of the adjustment layer onto the base substrate covers an orthographical projection of the transparent electrode onto the base substrate, and there is a non-overlapping area between the orthographical projection of the adjustment layer onto the base substrate, and the orthographical projection of the transparent electrode onto the base substrate.

In a possible implementation, in the pixel element according to some embodiments of this disclosure, a height of the control electrode is no less than a half of a height of the adjustment layer.

In a possible implementation, in the pixel element according to some embodiments of this disclosure, the control electrode is arranged at a layer same as a layer where the adjustment layer is, and the adjustment layer is arranged in a recess structure formed by the control electrode and the base substrate.

In a possible implementation, in the pixel element according to some embodiments of this disclosure, the transparent electrode is arranged on a side of the adjustment layer proximate to the base substrate, or the transparent electrode is arranged on a side of the adjustment layer away from the base substrate.

In a possible implementation, in the pixel element according to some embodiments of this disclosure, the adjustment layer includes a first adjustment layer and a second adjustment layer, the first adjustment layer is arranged on the side of the transparent electrode proximate to the base substrate, and the second adjustment layer is arranged on the side of the transparent electrode away from the base substrate.

In a possible implementation, in the pixel element according to some embodiments of this disclosure, the charged particles include light-absorbing charged particles.

In a possible implementation, in the pixel element according to some embodiments of this disclosure, the charged particles in the adjustment layer have at least two sizes.

In a second aspect, some embodiments of this disclosure provide a display control method applicable to a plurality of pixel elements according to any one of the implementations in the first aspect, the display area of the pixel element includes at least one sub-pixel element, wherein the method includes:

obtaining a display state of the sub-pixel element in the pixel element;

in response to that any one sub-pixel element in the pixel element is in the display state, applying signals for creating the second electric field to the control electrode and the transparent electrode respectively so that the charged particles in the adjustment layer move to the transparent electrode under the control of the second electric field; and in response to that none of the sub-pixel elements in the pixel element is in the display state, applying signals for creating the first electric field to the control electrode and the transparent electrode respectively so that the charged particles move to the control electrode under the control of the first electric field.

In a third aspect, some embodiments of this disclosure provide a method for fabricating a pixel element, the method including:

determining positions of a display area and a non-display area on a base substrate;

forming a control electrode at an interface between the display area and the non-display area using an electrically-conductive material;

forming an adjustment layer of a material doped with charged particles in the non-display area on the base substrate formed with the control electrode, wherein the control electrode surrounds the adjustment layer, and there is a gap area between the control electrode and the adjustment layer; and forming a transparent electrode of a transparent electrically-conductive material in the non-display area on the base substrate formed with the control electrode, wherein the adjustment layer and the transparent electrode layer are arranged in a stack;

wherein the charged particles are configured to move to the control electrode under a control of the first electric field, and to move to the transparent electrode under a control of the second electric field, wherein the first electric field and the second electric field are electric fields created after signals are applied to the control electrode and the transparent electrode respectively, and a direction of the first electric field is opposite to a direction of the second electric field.

In a possible implementation, in the method for fabricating a pixel element according to some embodiments of this disclosure, a recess structure is formed by the control electrode and the base substrate, and the forming the adjustment layer of the material doped with charged particles in the non-display area on the base substrate formed with the control electrode includes:

forming the adjustment layer of the material doped with charged particles in the recess structure.

In a possible implementation, in the method for fabricating a pixel element according to some embodiments of this disclosure, the forming the control electrode at the interface between the display area and the non-display area includes:

forming the control electrode at the interface between the display area and the non-display area, and an anode in the display area in a patterning process.

In a possible implementation, in the method for fabricating a pixel element according to some embodiments of this disclosure, the forming the transparent electrode in the non-display area on the base substrate formed with the control electrode includes:

forming the transparent electrode in the display area, and a cathode in the display area on the base substrate formed with the adjustment layer in a patterning process.

In a possible implementation, in the method for fabricating a pixel element according to some embodiments of this disclosure, the forming the adjustment layer in the non-display area on the base substrate formed with the control electrode includes:

forming the adjustment layer in the non-display area on the base substrate formed with the transparent electrode after the transparent electrode is formed in the non-display area on the base substrate formed with the control electrode; or the forming the adjustment layer in the non-display area on the base substrate formed with the control electrode includes:

forming a first adjustment layer in the non-display area on the base substrate formed with the control electrode; and forming a second adjustment layer in the non-display area on the base substrate formed with the transparent electrode after the transparent electrode is formed in the non-display area on the base substrate formed with the first adjustment layer.

In a fourth aspect, some embodiments of this disclosure provide a display panel including a plurality of pixel elements according to any one of the implementations in the first aspect, which are arranged in array on the base substrate.

In a fifth aspect, some embodiments of this disclosure provide a display device including the display panel in the fourth aspect.

BRIEF DESCRIPTION OF THE DRAWINGS

In order to make the technical solutions according to the embodiments of this disclosure more apparent, the drawings to which reference is to be made in the description of the embodiments will be introduced below in brief, and apparently the drawings to be described below illustrates only some embodiments of this disclosure, and those ordinarily skilled in the art can further derive other drawings from these drawings without any inventive effort.

DETAILED DESCRIPTION OF THE EMBODIMENTS

In order to make the objects, technical solutions, and advantages of this disclosure more apparent, the embodiments of this disclosure will be described below in further details with reference to the drawings.

In the related art, in order to improve the contrast of an image displayed on the display panel, a circular polarizer sheet is typically arranged in the display panel to shield a part of light entering the display panel to thereby reduce the amount of light transmitted through the display panel so as to improve the contrast of the image by lowering the brightness of the display panel.

However, while a pixel element is displaying or not displaying, the circular polarizer sheet shields light so that there is lower brightness of the display panel while the pixel element is not displaying, thus degrading the efficiency of light emission from the display panel.

Figure 1:
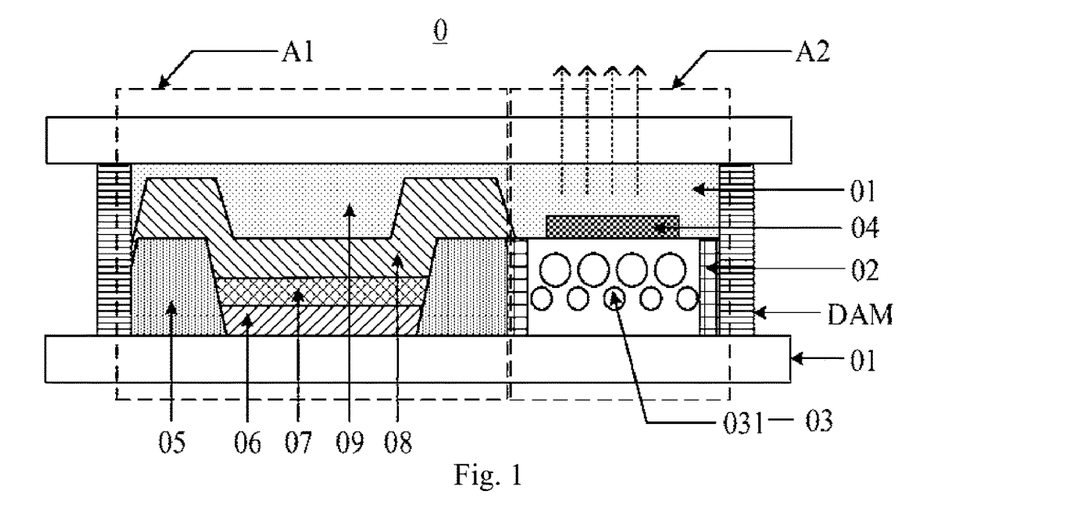
FIG. 1 is a schematic structural diagram of a pixel element according to some embodiments of this disclosure.

In view of the problem above, some embodiments of this disclosure provides a pixel element 0 as illustrated in FIG. 1, which includes: a base substrate 01, and a display area A1 and a non-display area A2 located on the base substrate 01; a control electrode 02, an adjustment layer 03, and a transparent electrode 04 located in the non-display area A2, where the adjustment layer 03 and the transparent electrode 04 are arranged in a stack, the control electrode 02 is located at the interface between the display area A1 and the non-display area A2, and surrounds the adjustment layer 03, and there is a gap area between the control electrode 02 and the adjustment layer 03.

Figure 2:
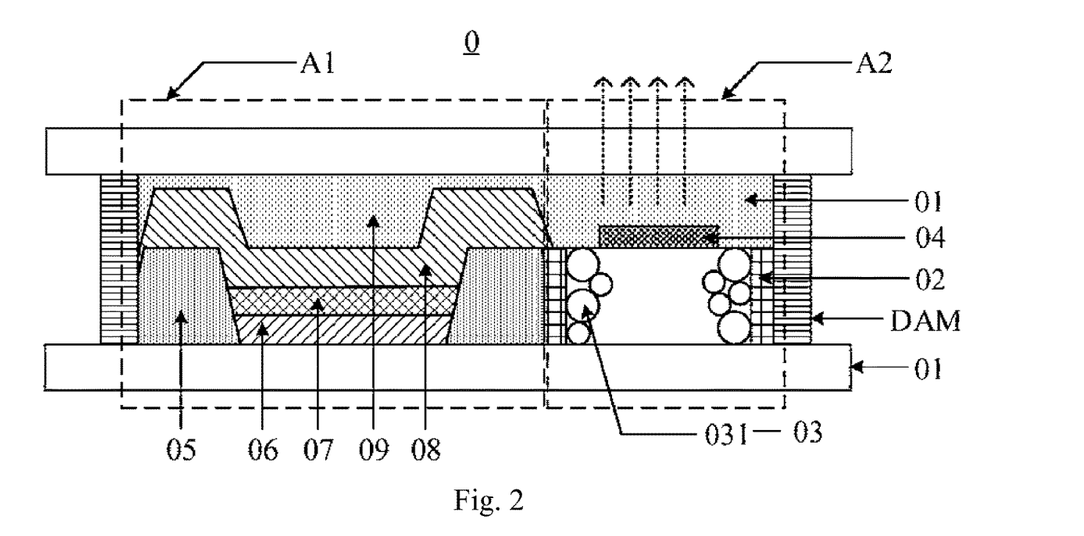
FIG. 2 is a schematic structural diagram of another pixel element according to some embodiments of this disclosure.

The adjustment layer 03 can include charged particles 031 configured to move to the control electrode 02 (as illustrated in FIG. 2) under the action of a first electric field, and to move to the transparent electrode 04 (as illustrated in FIG. 1) under the action of a second electric field.

The control electrode 02 is arranged at the interface between the display area A1 and the non-display area A2, and extends in a direction parallel to a light exit direction of the pixel element 0 (as denoted by dotted arrows in FIG. 1), and the transparent electrode 04 extends in a direction perpendicular to the light exit direction.

Here the first electric field and the second electric field are electric fields created after signals are applied to the control electrode 02 and the transparent electrode 04 respectively, and the direction of the first electric field is opposite to the direction of the second electric field.

In summary, in the pixel element according to the embodiment of this disclosure, the control electrode, the adjustment layer, and the transparent electrode are arranged in the non-display area of the pixel element, and the charged particles at the adjustment layer can move to the control electrode or the transparent electrode under the action of the electric field, so that after the charged particles move to the transparent electrode, the charged particles can block a part of light entering a display panel to thereby improve the contrast of a displayed image, and after the charged particles move to the control electrode, the charged particles will not shield any light entering the display panel. As compared with the related art, the brightness of the display panel while the pixel element is not displaying can be guaranteed while improving the contrast of the displayed image, thus improving the efficiency of light emission from the display panel.

It shall be noted that the gap area shall exit between the control electrode and the adjustment layer to thereby insulate the control electrode from the adjustment layer so that the electric field in the preset direction is created when preset voltage is applied to the control electrode and the transparent electrode to drive the charged particles at the adjustment layer to move in the preset direction so that the light is shielded or transmitted in the non-display area.

Optionally, in the pixel element according to embodiments of this disclosure, an insulation material is filled in the gap area. In this way, the control electrode can be better insulated from the adjustment layer.

Optionally, in the pixel element according to embodiments of this disclosure, the charged particles 031 can include light-absorbing charged particles 031. By way of an example, the charged particles 031 can be metal ions or charged nanometer particles. When the charged particles 031 are light-absorbing charged particles 031, after the charged particles 031 move to the transparent electrode 04, the charged particles 031 can shield the light entering the display panel, but also can absorb the light entering the display panel, to thereby further reduce the amount of light entering the display panel so as to further improve the efficiency of light emission from the display panel.

Furthermore, there are at least two sizes of the charged particles 031 at the adjustment layer, that is, there are charged particles 031 with at least two sizes at the adjustment layer. When the charged particles 031 include charged particles 031 with a plurality of sizes, as illustrated in FIG. 1, the charged particles 031 with the plurality of sizes can be arranged alternately, and after the charged particles 031 move to the transparent electrode 04, the charged particles 031 can be spread as widely as possible on the light exit face in the non-display area A2 to thereby block the light entering the display panel as much as possible. When there are a plurality of sizes of the charged particles 031, as illustrated in FIG. 2, after the charged particles 031 move to the control electrode 02, the total volume occupied by all the charged particles 031 at the adjustment layer 03 is narrowed so that the charged particles 031 can shield the light as little as possible to thereby further improve the efficiency of light emission from the display panel.

Figure 3:
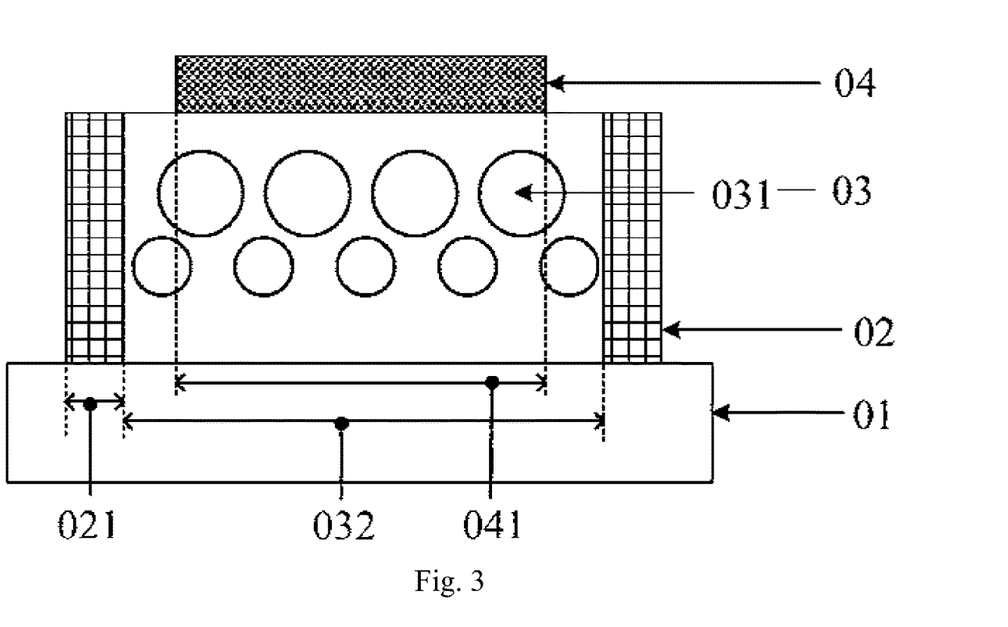
FIG. 3 is a schematic diagram of a magnified part of a pixel element according to some embodiments of this disclosure.

In an optional implementation, as illustrated in FIG. 3 which is a schematic diagram of a magnified part of the non-display area, a orthographical projection 032 of the adjustment layer 03 onto the base substrate 01 can cover a orthographical projection 041 of the transparent electrode 04 onto the base substrate 01, and there is a non-overlapping area between the orthographical projection 032 of the adjustment layer 03 onto the base substrate 01, and the orthographical projection 041 of the transparent electrode 04 onto the base substrate 01. In this way, the charged particles 031 can move in a large range, and after the charged particles 031 move to the transparent electrode 04, the charged particles 031 can be spread as widely as possible on the light exit face in the non-display area A2 to thereby block the light entering the display panel as much as possible; and after the charged particles 031 move to the control electrode 02, the charged particles 031 can be as close as possible to the control electrode 02 to thereby shield the light as little as possible so as to further improve the efficiency of light emission from the display panel.

Optionally, in the pixel element according to embodiments of this disclosure, the height of the control electrode is no less than a half of the height of the adjustment layer. In order to guarantee the intensity of the electric field created between the control electrode and the transparent electrode, the height of the control electrode shall be set to a half of the height of the adjustment layer, and if the height of the control electrode is too small, then the electric field created between the control electrode and the transparent electrode may not be sufficient to drive the charged electrons at the adjustment layer to move.

Optionally, in the pixel element according to embodiments of this disclosure, as illustrated in FIG. 1, the control electrode 02 can be arranged at the same layer as the adjustment layer 03. Furthermore since the control electrode 02 is arranged at the interface between the display area A1 and the non-display area A2, a recess structure can be formed by the control electrode 02 and the base substrate 01, and the adjustment layer 03 can be arranged in the recess structure. In this way, the charged particles 031 can move in a large range so that after the charged particles 031 move to the transparent electrode 04, they can block the light entering the display panel as much as possible, and after the charged particles 031 move to the control electrode 02, they can shield the light as little as possible to thereby further improve the efficiency of light emission from the display panel.

In embodiments of this disclosure, the transparent electrode 04 and the adjustment layer 03 can be arranged in a number of implementations, and the following three implementations will be described below in the embodiment of this disclosure.

Figure 4:
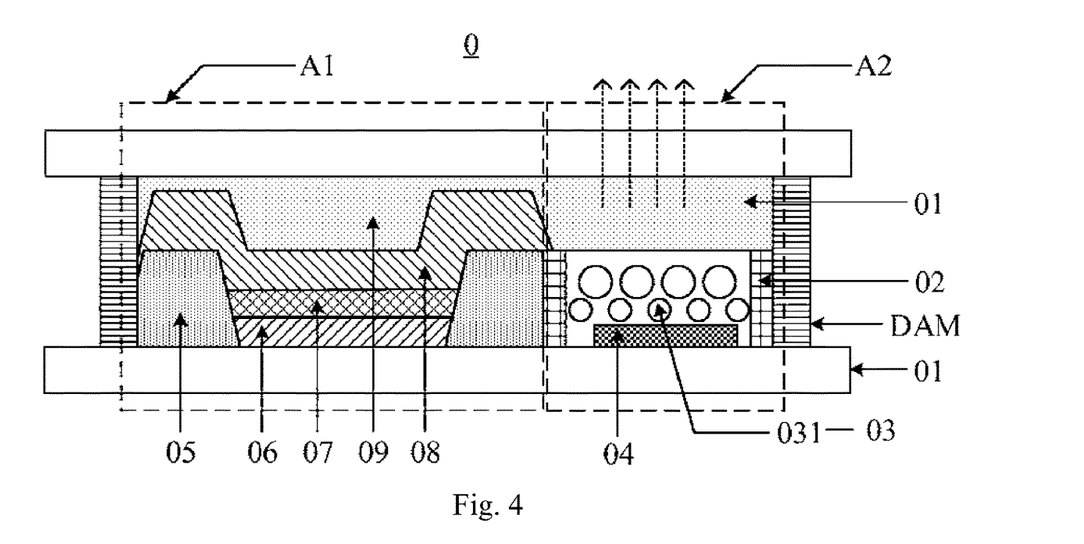
FIG. 4 is a schematic structural diagram of another pixel element according to still another embodiment of this disclosure.

In a first implementation, as illustrated in FIG. 4, the transparent electrode 04 is arranged on the side of the adjustment layer 03 proximate to the base substrate 01. At this time, the transparent electrode 04 and the adjustment layer 03 can be arranged in a stack on the base substrate 01 arranged with the control electrode 02.

In a second implementation, as illustrated in FIG. 1 or FIG. 2, the transparent electrode 04 is arranged on the side of the adjustment layer 03 away from the base substrate 01. At this time the adjustment layer 03 and the transparent electrode 04 can be arranged in a stack on the base substrate 01 arranged with the control electrode 02.

Figure 5:
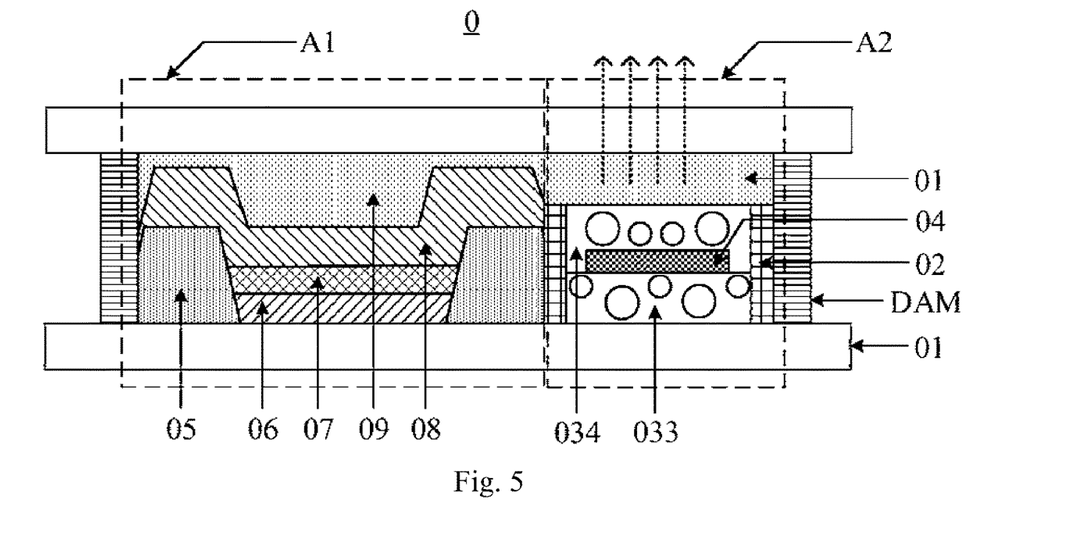
FIG. 5 is a schematic structural diagram of another pixel element according to a further embodiment of this disclosure.

In a third implementation, as illustrated in FIG. 5, the adjustment layer 03 can include a first adjustment layer 033 and a second adjustment layer 034, where the first adjustment layer 033 is arranged on the side of the transparent electrode 04 proximate to the base substrate 01, and the second adjustment layer 034 is arranged on the side of the transparent electrode 04 away from the base substrate 01. At this time, the first adjustment layer 033, the transparent electrode 04, and the second adjustment layer 034 can be arranged in a stack on the base substrate 01 arranged with the control electrode 02.

Still as illustrated in FIG. 1 to FIG. 5, a pixel definition layer 05, an anode 06, a light-emitting layer 07, a cathode 08, a color-resist layer 08 (including filtering sheets in a plurality of colors), etc., can be further arranged in the display area A1 of the pixel element 0. A dam can be formed in the pixel element 0, and configured to prevent a material of a layer in the pixel element 0 from being diffused undesignedly on the base substrate 01 while the layer is being formed.

Optionally, the anode and the control electrode 02 can be made of the same material. At this time, the anode and the control electrode 02 can be formed in the same patterning process. Alike the cathode 08 and the transparent electrode 04 can be made of the same material. At this time, the cathode 08 and the transparent electrode 04 can be formed in the same patterning process.

Here, the pixel element 0 can emit light away from the base substrate 01, and at this time, in order to further improve the efficiency of light emission from the display panel, the anode can be made of a reflecting material so that the reflecting anode can reflect light incident on the anode to thereby increase the amount of light exiting the display panel so as to improve the efficiency of light emission from the display panel.

In summary, in the pixel element according to the embodiment of this disclosure, the control electrode, the adjustment layer, and the transparent electrode are arranged in the non-display area of the pixel element, and the charged particles at the adjustment layer can move to the control electrode or the transparent electrode under the action of the electric field, so that after the charged particles move to the transparent electrode, the charged particles can block a part of the light entering the display panel to thereby improve the contrast of the displayed image, and after the charged particles move to the control electrode, the charged particles will not shield any light entering the display panel. As compared with the related art, the brightness of the display panel while the pixel element is not displaying can be guaranteed while improving the contrast of the displayed image, thus improving the efficiency of light emission from the display panel. Furthermore since the service lifetime of the display panel may be degraded due to the circular polarizer sheet in the related art, no circular polarizer sheet will be arranged in the display panel including the pixel element according to the embodiment of this disclosure, thus prolonging the service lifetime of the display panel.

Figure 6:
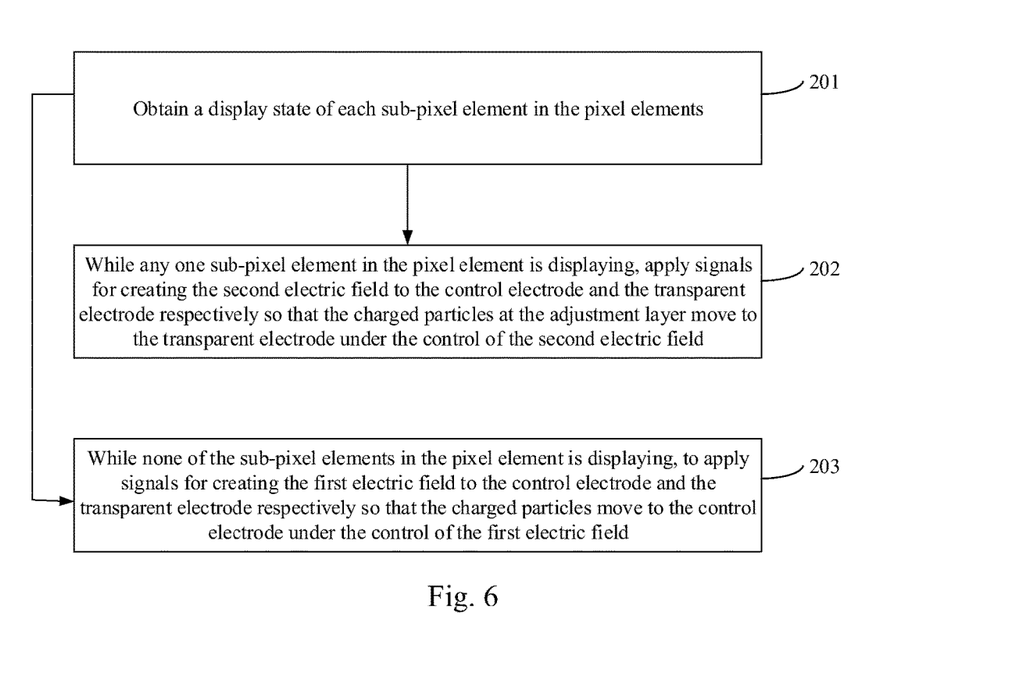
FIG. 6 is a flow chart of a display control method according to some embodiments of this disclosure.

Some embodiments of this disclosure provides a display control method applicable to the pixel element according to any one of the embodiments above of this disclosure, where there is at least one sub-pixel element in the display area of each pixel element. As illustrated in FIG. 6, the method can include the following steps.

The step 201 is to obtain a display state of each sub-pixel element in each pixel element.

After the display state of each sub-pixel element in each pixel element is obtained, the charged particles can be controlled according to the display state so that the charged particles move in different directions at different display states to thereby improve the transmittivity of the display panel.

The step 202 is, while any one sub-pixel element in the pixel element is displaying, to apply signals for creating the second electric field to the control electrode and the transparent electrode respectively so that the charged particles at the adjustment layer move to the transparent electrode under the control of the second electric field.

While the sub-pixel element in the pixel element is displaying, the charged particles are controlled to move to the transparent electrode so that the charged particles can block the light entering the display panel to thereby lower the transmittivity of the display panel, and to improve the display effect of the image seen by the user due to the lowered transmittivity so as to improve the contrast of the displayed image.

In the step 202, applying the signals for creating the second electric field to the control electrode and the transparent electrode respectively can include: obtaining the electrical property (positivity or negativity) of the charged particles at the adjustment layer, and to applying the signal for creating the second electric field to the control electrode and the transparent electrode respectively according to the positivity or negativity of the charged particle.

For example, when the charged particles are positively charged ions, a positive-voltage signal can be applied to the transparent electrode, and a negative-voltage signal can be applied to the control electrode to thereby create the second electric field. When the charged particles are negatively charged ions, a negative-voltage signal can be applied to the transparent electrode, and a positive-voltage signal can be applied to the control electrode to thereby create the second electric field.

The step 203 is, while none of the sub-pixel elements in the pixel element is displaying, to apply signals for creating the first electric field to the control electrode and the transparent electrode respectively so that the charged particles move to the control electrode under the control of the first electric field.

Here, the direction of the first electric field is opposite to the direction of the second electric field.

While the sub-pixel elements in the pixel element are not displaying, the charged particles are controlled to move to the control electrode so that the charged particles can block the light entering the display panel as little as possible, or the charged particles will not shield any light entering the display panel, to thereby improve the transmittivity of the display panel so that the user can see an object on the backside of the display panel more clearly through the display panel, thus improving the transparent display effect.

In the step 203, applying the signals for creating the first electric field to the control electrode and the transparent electrode respectively can include: obtaining the electrical property (positivity or negativity) of the charged particles at the adjustment layer, and to applying the signal for creating the first electric field to the control electrode and the transparent electrode respectively according to the positivity or negativity of the charged particle.

For example, when the charged particles are positively charged ions, a negative-voltage signal can be applied to the transparent electrode, and a positive-voltage signal can be applied to the control electrode to thereby create the first electric field. When the charged particles are negatively charged ions, a positive-voltage signal can be applied to the transparent electrode, and a negative-voltage signal can be applied to the control electrode to thereby create the first electric field.

In summary, in the display control method according to the embodiment of this disclosure, the signals are applied to the control electrode and the transparent electrode according to the display states of the sub-pixel elements in the pixel element so that the charged particles can be controlled according to the display state of the pixel element to move to the control electrode or the transparent electrode under the action of the electric field, and after the charged particles move to the transparent electrode, the charged particles can block a part of the light entering the display panel to thereby improve the contrast of the displayed image; and after the charged particles move to the control electrode, the charged particles will not shield any light entering the display panel. As compared with the related art, the brightness of the display panel while the pixel element is not displaying can be guaranteed to thereby improve the efficiency of light emission from the display panel.

Figure 7:
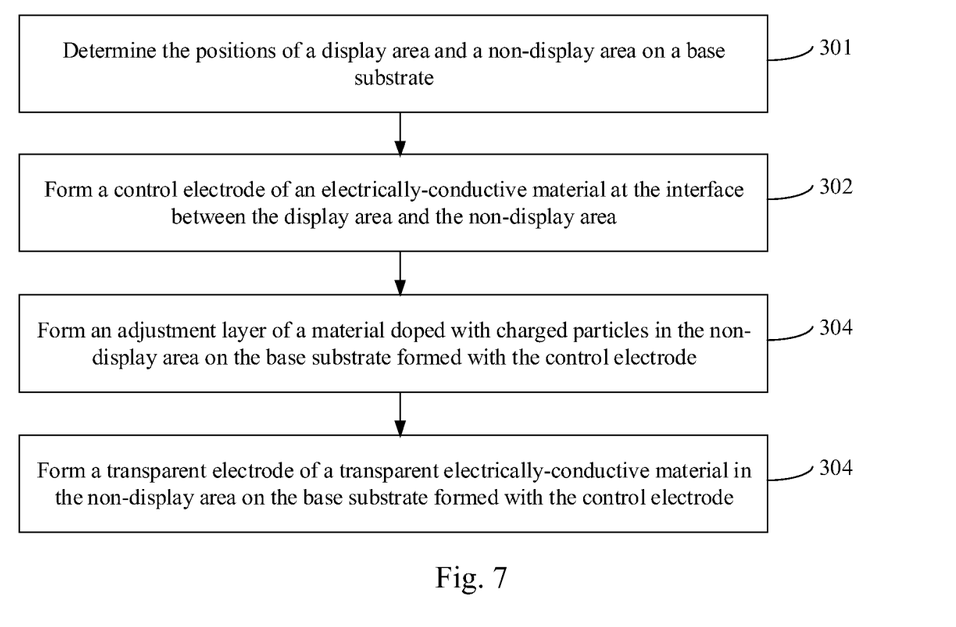
FIG. 7 is a flow chart of a method for fabricating a pixel element according to some embodiments of this disclosure.

As illustrated in FIG. 7, some embodiments of this disclosure provide a method for fabricating a pixel element, where the method can include the following steps.

The step 301 is to determine the positions of a display area and a non-display area on a base substrate.

Before a pixel element is fabricated, the positions of the display area and the non-display area in the pixel element can be planned in advance so that corresponding layers are formed in the planned layers, where the base substrate can be a transparent substrate, a flexible substrate, or a substrate made of glass, quartz, transparent resin, Polyimide (PI), a thin metal sheet, or another light-guiding material with some rigidness.

The step 302 is to form a control electrode of an electrically-conductive material at the interface between the display area and the non-display area.

Here, the formed control electrode can extend in a direction parallel to a light exit direction of the pixel element, and the control electrode is formed at the interface between the display area and the non-display area.

A layer of electrically-conductive material with some thickness can be deposited on the base substrate through magnetically controllable spraying, thermal evaporation, Plasma Enhanced Chemical Vapor Deposition (PECVD), etc., to form a control electrode layer, and then the control electrode layer can be patterned in a patterning process to form the control electrode, where the patterning process can include coating, exposing, developing, etching, and stripping photoresist. Optionally, the electrically-conductive material can refer to one electrically-conductive material, e.g., metal or Indium Tin Oxide (ITO), or a plurality of electrically-conductive materials, e.g., metal Ag and ITO, and the control electrode formed of the metal Ag and the ITO can be structured in a stack of an ITO layer, a metal Ag layer, and an ITO layer. The thickness of the control electrode layer can be set as needed in reality.

The step 303 is to form an adjustment layer of a material doped with charged particles in the non-display area on the base substrate formed with the control electrode, where the control electrode surrounds the adjustment layer, and there is a gap area between the control electrode and the adjustment layer.

A layer of material doped with charged particles with some thickness can be formed in the non-display area on the base substrate formed with the control electrode through coating to form the adjustment layer, where the thickness of the adjustment layer, and the material doped with charged particles can be set as needed in reality. For example, the material doped with charged particles can be glue doped with charged nanometer particles, where the glue can be glue with a viscosity below a preset threshold (e.g., Polyimide). When the glue is glue with a low viscosity, the charged particles can move in effect under the control of an electric field.

Optionally, since the control electrode is arranged at the interface between the display area and the non-display area, a recess structure can be formed by the control electrode and the base substrate, so an implementation of the step 303 can include forming the adjustment layer of the material doped with charged particles in the recess structure. The adjustment layer is formed so that the charged particles can move in a large range, so after the charged particles move to the transparent electrode, the charged particles can block light entering a display panel as much as possible; and after the charged particles move to the control electrode, the charged particles can shield the light as little as possible so as to further improve the efficiency of light emission from the display panel.

The step 304 is to form a transparent electrode of a transparent electrically-conductive material in the non-display area on the base substrate formed with the control electrode, where the adjustment layer and the transparent electrode layer are arranged in a stack.

Here, the formed transparent electrode can extend in a direction perpendicular to the light exit direction, and the adjustment layer and the transparent electrode layer are arranged in a stack. The charged particles are configured to move to the control electrode under the control of the first electric field, and to move to the transparent electrode under the control of the second electric field, where the first electric field and the second electric field are electric fields created after signals are applied to the control electrode and the transparent electrode respectively, and the direction of the first electric field is opposite to the direction of the second electric field.

A layer of transparent electrically-conductive material with some thickness can be deposited on the base substrate through magnetically controllable spraying, thermal evaporation, a PECVD, etc., to form a transparent electrode layer, and then the transparent electrode layer can be patterned in a patterning process to form the transparent electrode, where the patterning process can include coating, exposing, developing, etching, and stripping photoresist, and the thickness of the transparent electrode layer, and the transparent electrically-conductive material can be set as needed in reality. For example, the transparent electrically-conductive material can be metal Ag, metal Mg, Indium Zinc Oxide (IZO), etc.

In summary, in the method for fabricating a pixel element according to the embodiment of this disclosure, the control electrode, the adjustment layer, and the transparent electrode are arranged in the non-display area of the pixel element fabricated using this method, and the charged particles at the adjustment layer can move to the control electrode or the transparent electrode under the control of the electric field, so that after the charged particles move to the transparent electrode, the charged particles can block a part of light entering a display panel to thereby improve the contrast of a displayed image, and after the charged particles move to the control electrode, the charged particles will not shield any light entering the display panel. As compared with the related art, the brightness of the display panel while the pixel element is not displaying can be guaranteed to thereby improve the efficiency of light emission from the display panel.

Optionally, in the display area, a pixel definition layer can be further formed through coating, exposing, etching, etc., an anode can be further formed through magnetically controllable spraying, thermal evaporation, a PECVD, etc., a light-emitting layer can be further formed through evaporation and plating, a cathode and a color-resist layer (including filtering sheets in a plurality of colors) can be further formed through magnetically controllable spraying, thermal evaporation, a PECVD, etc., and a dam can be further formed, where the dam is configured to prevent a material of a layer in the pixel element from being diffused undesignedly on the base substrate while the layer is being formed.

Here, the anode and the control electrode can be made of the same material. At this time, an implementation of the step 302 can include: forming the control electrode at the interface between the display area and the non-display area, and the anode in the display area in a pattering process. When the control electrode and the anode are formed in the patterning process, the process of fabricating the pixel element can be simplified.

Alike the cathode and the transparent electrode can be made of the same material. At this time, an implementation of the step 304 can include forming the transparent electrode in the non-display area, and the cathode in the display area on the base substrate formed with the adjustment layer in a pattering process. In this implementation, the transparent electrode is arranged on the side of the adjustment layer away from the base substrate. When the transparent electrode and the cathode are formed in the patterning process, the process of fabricating the pixel element can be simplified.

Moreover, there may be at least the following two further optional implementations of the step 303.

In a first optional implementation, the implementation of the step 303 can include: forming the adjustment layer in the non-display area on the base substrate formed with the transparent electrode after the transparent electrode is formed in the non-display area on the base substrate formed with the control electrode.

In a second optional implementation, the adjustment layer can include a first adjustment layer and a second adjustment layer. At this time, the implementation of the step 303 can include: forming the first adjustment layer in the non-display area on the base substrate formed with the control electrode; and forming the second adjustment layer in the non-display area on the base substrate formed with the transparent electrode after the transparent electrode is formed in the non-display area on the base substrate formed with the first adjustment layer.

In summary, in the method for fabricating a pixel element according to the embodiment of this disclosure, the control electrode, the adjustment layer, and the transparent electrode are arranged in the non-display area of the pixel element fabricated using this method, and the charged particles at the adjustment layer can move to the control electrode or the transparent electrode under the action of the electric field, so that after the charged particles move to the transparent electrode, the charged particles can block a part of light entering a display panel to thereby improve the contrast of a displayed image, and after the charged particles move to the control electrode, the charged particles will not shield any light entering the display panel. As compared with the related art, the brightness of the display panel while the pixel element is not displaying can be guaranteed while improving the contrast of the displayed image, thus improving the efficiency of light emission from the display panel.

Some embodiments of this disclosure provide a display panel including a plurality of pixel elements according to any one of the embodiments above of this disclosure, which are arranged in an array on the base substrate. The display panel can be a liquid crystal panel, electronic paper, an Organic Light-Emitting Diode (OLED) panel, a mobile phone, a tablet computer, a TV set, a monitor, a notebook computer, a digital photo frame, a navigator, or any other component with a display function.

Some embodiments of this disclosure provide a display device including the display panel according to the embodiment above of this disclosure, where the display device can be a public information display device which can display public information in a transparent mode to thereby coordinate presentation, interaction, advertisement, etc. For example, the display device can be a commodity display window, a transparent display on a refrigerator door, an automatic vendor machine, etc.

The foregoing description is illustrative of the preferred embodiments of this disclosure, but not intended to limit this disclosure thereto, and any modifications, equivalents, adaptations, etc., made thereto without departing from the spirit of this disclosure shall fall into the claimed scope of this disclosure.

The invention claimed is:

1. A pixel element, comprising a base substrate, and a display area and a non-display area located on the base substrate, wherein the pixel element further comprises:
   a control electrode, an adjustment layer, and a transparent electrode located in the non-display area, wherein the adjustment layer and the transparent electrode are arranged in a stack, the control electrode is located at an interface between the display area and the non-display area, and surrounds the adjustment layer, and there is a gap area between the control electrode and the adjustment layer; and
   the adjustment layer comprises charged particles configured to move to the control electrode under a control of a first electric field, and to move to the transparent electrode under a control of a second electric field, wherein the first electric field and the second electric field are electric fields created after signals are applied to the control electrode and the transparent electrode respectively, and a direction of the first electric field is opposite to a direction of the second electric field.

2. The pixel element according to claim 1, wherein an insulation material is filled in the gap area.

3. The pixel element according to claim 1, wherein an orthographical projection of the adjustment layer onto the base substrate covers an orthographical projection of the transparent electrode onto the base substrate, and there is a non-overlapping area between the orthographical projection of the adjustment layer onto the base substrate, and the orthographical projection of the transparent electrode onto the base substrate.

4. The pixel element according to claim 1, wherein a height of the control electrode is no less than a half of a height of the adjustment layer.

5. The pixel element according to claim 4, wherein the control electrode is arranged at the same layer as the adjustment layer, and the adjustment layer is arranged in a recess structure formed by the control electrode and the base substrate.

6. The pixel element according to claim 1, wherein the transparent electrode is arranged on a side of the adjustment layer proximate to the base substrate.

7. The pixel element according to claim 1, wherein the transparent electrode is arranged on a side of the adjustment layer away from the base substrate.

8. The pixel element according to claim 1, wherein the adjustment layer comprises a first adjustment layer and a second adjustment layer, the first adjustment layer is arranged on a side of the transparent electrode proximate to the base substrate, and the second adjustment layer is arranged on a side of the transparent electrode away from the base substrate.

9. The pixel element according to claim 1, wherein the charged particles comprise light-absorbing charged particles.

10. The pixel element according to claim 1, wherein the charged particles in the adjustment layer have at least two sizes.

11. A display control method, applicable to a plurality of pixel elements according to claim 1, the display area of the pixel element comprises at least one sub-pixel element, wherein the method comprises:
   obtaining a display state of the sub-pixel element in the pixel element;
   in response to that any one sub-pixel element in the pixel element is in the display state, applying signals for creating the second electric field to the control electrode and the transparent electrode respectively so that the charged particles in the adjustment layer move to the transparent electrode under the control of the second electric field; and
   in response to that none of the sub-pixel elements in the pixel element is the display state, applying signals for creating the first electric field to the control electrode and the transparent electrode respectively so that the charged particles move to the control electrode under the control of the first electric field.

12. A display panel, comprising a plurality of pixel elements according to claim 1, which are arranged in an array on the base substrate.

13. A display device, comprising the display panel according to claim 12.

14. A method for fabricating a pixel element, comprising:
   determining positions of a display area and a non-display area on a base substrate;
   forming a control electrode at an interface between the display area and the non-display area using an electrically-conductive material;
   forming an adjustment layer of a material doped with charged particles in the non-display area on the base substrate formed with the control electrode, wherein the control electrode surrounds the adjustment layer, and there is a gap area between the control electrode and the adjustment layer; and
   forming a transparent electrode of a transparent electrically-conductive material in the non-display area on the base substrate formed with the control electrode, wherein the adjustment layer and the transparent electrode layer are arranged in a stack;
   wherein the charged particles are configured to move to the control electrode under a control of the first electric field, and to move to the transparent electrode under a control of the second electric field, wherein the first electric field and the second electric field are electric fields created after signals are applied to the control electrode and the transparent electrode respectively, and a direction of the first electric field is opposite to a direction of the second electric field.

15. The method according to claim 14, wherein a recess structure is formed by the control electrode and the base substrate, and the forming the adjustment layer of the material doped with charged particles in the non-display area on the base substrate formed with the control electrode comprises:
   forming the adjustment layer of the material doped with charged particles in the recess structure.

16. The method according to claim 14, wherein the forming the control electrode at the interface between the display area and the non-display area comprises:
   forming the control electrode at the interface between the display area and the non-display area, and an anode in the display area in a patterning process.

17. The method according to claim 14, wherein the forming the transparent electrode in the non-display area on the base substrate formed with the control electrode comprises:
   forming the transparent electrode in the display area, and a cathode in the display area on the base substrate formed with the adjustment layer in a patterning process.

18. The method according to claim 14, wherein the forming the adjustment layer in the non-display area on the base substrate formed with the control electrode comprises:
   forming the adjustment layer in the non-display area on the base substrate formed with the transparent electrode after the transparent electrode is formed in the non-display area on the base substrate formed with the control electrode; or
   the forming the adjustment layer in the non-display area on the base substrate formed with the control electrode comprises:
   forming a first adjustment layer in the non-display area on the base substrate formed with the control electrode; and
   forming a second adjustment layer in the non-display area on the base substrate formed with the transparent electrode after the transparent electrode is formed in the non-display area on the base substrate formed with the first adjustment layer.

* * * * *